(12) United States Patent
Jeon

(10) Patent No.: US 6,255,716 B1
(45) Date of Patent: Jul. 3, 2001

(54) BIPOLAR JUNCTION TRANSISTORS HAVING BASE ELECTRODE EXTENSIONS

(75) Inventor: Hee-Seog Jeon, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/502,343

(22) Filed: Feb. 10, 2000

Related U.S. Application Data

(62) Division of application No. 09/085,777, filed on May 28, 1997, now Pat. No. 6,048,773.

(30) Foreign Application Priority Data

| May 28, 1997 | (KR) | ................................................ | 97-21093 |
| May 28, 1997 | (KR) | ................................................ | 97-21093 |

(51) Int. Cl.[7] .................................................. H01L 27/102
(52) U.S. Cl. ........................... 257/587; 257/588; 257/592; 438/558; 438/564; 438/350
(58) Field of Search ................................. 257/587, 588, 257/592; 438/350, 349, 558, 564

(56) References Cited

U.S. PATENT DOCUMENTS

| 4,996,581 | * | 2/1991 | Hamasaki . | |
| 5,187,554 | * | 2/1993 | Miwa | .................................... 257/587 |
| 5,512,785 | * | 4/1996 | Haver et al. | ........................... 257/587 |
| 5,541,124 | * | 7/1996 | Miwa et al. | ........................... 257/592 |
| 5,654,211 | * | 8/1997 | Ham . | |
| 5,721,147 | | 2/1998 | Yoon | ....................................... 437/31 |

OTHER PUBLICATIONS

A. W. Wieder, "Submicron Bipolar Technology: New Chances for High Speed Applications," IEDM Article, pp. 8–11 (1986).

* cited by examiner

Primary Examiner—Trung Dang
(74) Attorney, Agent, or Firm—Myers Bigel Sibley & Sajovec

(57) ABSTRACT

Methods of forming bipolar junction transistors having preferred base electrode extensions include the steps of forming a base electrode of second conductivity type (e.g., P-type) on a face of a substrate. A conductive base electrode extension layer is then formed in contact with a sidewall of the base electrode. The base electrode extension layer may be doped or undoped. An electrically insulating base electrode spacer is then formed on the conductive base electrode extension layer, opposite the sidewall of the base electrode. The conductive base electrode extension layer is then etched to define a L-shaped base electrode extension, using the base electrode spacer as an etching mask. Dopants of second conductivity type are then diffused from the base electrode, through the base electrode extension and into the substrate to define an extrinsic base region therein. This diffusion step can be performed in a carefully controlled manner to limit the extent to which the extrinsic base region dopants adversely effect the electrical characteristics of surrounding regions or contribute to parasitic capacitance. Dopants of second conductivity type are also preferably implanted into the substrate to define an intrinsic base region therein. This dopant implant step is preferably performed using the base electrode spacer as an implant mask. Accordingly, the base electrode spacer is used advantageously as an etching mask and as a dopant implantation mask. An emitter region of first conductivity type is also preferably formed in the intrinsic base region.

4 Claims, 9 Drawing Sheets

BIPOLAR JUNCTION TRANSISTORS HAVING BASE ELECTRODE EXTENSIONS

This application is a Division of application Ser. No. 09/085,777 filed May 28, 1998 now U.S. Pat. No. 6,048,773.

FIELD OF THE INVENTION

The present invention relates to methods of forming semiconductor devices and devices formed thereby, and more particularly to methods of forming bipolar junction transistors and bipolar junction transistors formed thereby.

BACKGROUND OF THE INVENTION

As state-of-the-art computer systems and circuits evolve, there is a continuing need for higher performance bipolar junction transistors capable of operating at higher switching speeds, with increasing degrees of device integration, and with low rate of failure. There is also a continuing need to shrink or scale down device size to obtain improved device performance.

An attempt to form bipolar junction transistors with reduced lateral dimensions using self-alignment techniques is disclosed in an article by Armin W. Wieder entitled "Submicron Bipolar Technology: New Chances For High Speed Applications", IEDM, pp. 8–11, (1986). Another attempt to form bipolar junction transistors having self-aligned regions therein is disclosed in U.S. Pat. No. 5,721,147 to Yoon, entitled "Methods of Forming Bipolar Junction Transistors", the disclosure of which is hereby incorporated herein by reference. Referring now to FIGS. 1–4, another conventional method of forming a bipolar junction transistor includes the steps of forming an N-type epitaxial layer 10 (as a collector region) on a P-type substrate (not shown). Field oxide isolation regions 11 may also be formed in the epitaxial layer 10, using conventional techniques. A first polysilicon layer 12 may be formed on a face of the epitaxial layer 10 and on the isolation regions 11, as illustrated best by FIG. 1. This first polysilicon layer 12 may be formed as a P-type layer by implanting P-type impurities into the first polysilicon layer 12. A first oxide layer 13 is then formed on the first polysilicon layer 12. Referring now to FIG. 2, a masked etching step is then performed to selectively etch through portions of the first oxide layer 13 and first polysilicon layer 12 and expose the N-type epitaxial layer 10. A second oxide layer 14 may then be deposited on the exposed portion of the N-type epitaxial layer 10, as illustrated. A relatively highly doped extrinsic base region 15 may then be formed by out-diffusing dopants from the patterned first polysilicon layer 12 into the epitaxial layer 10. A more lightly doped base link-up region 16 may then be formed by implanting P-type dopants (e.g., B or $BF_2$) through the second oxide layer 14 and into the epitaxial layer 10. The second oxide layer 14 may then be removed.

Referring now to FIG. 3, oxide spacers 17 are then formed on the etched sidewalls of the first polysilicon layer 12 and first oxide layer 13, as illustrated. P-type dopants are again implanted into the epitaxial layer 10 to form an intrinsic base region 18 therein. Here, the oxide spacers 17 and first oxide layer 13 act as an implant mask. Referring now to FIG. 4, an N-type emitter contact 19 is then formed on the intrinsic base region. This N-type emitter contact 19 may be formed by depositing an undoped layer of polysilicon, implanting N-type dopants (e.g., arsenic) into the undoped layer of polysilicon and then patterning the layer of polysilicon using conventional techniques. An annealing step may then be performed to cause out-diffusion of N-type dopants from the emitter contact 19 into the intrinsic base region 18, to define an emitter region 20 therein.

Unfortunately, because it may be difficult to accurately control the thickness of the above-described oxide spacers 17, it may also be difficult to control important transistor characteristics such as emitter-base junction breakdown voltage ($BV_{ebo}$) current gain β, unit cutoff frequence $f_T$, base resistance, perimeter punch-through voltage, etc. Moreover, because the base link-up region 16 may have a lower P-type doping concentration therein, the formation of thick oxide spacers 17 may cause the base resistance to be unnecessarily large. In addition, the characteristics of the intrinsic base region 18 may not be independently controllable since this region also receives dopants during the step of forming the base link-up region 16.

Thus, notwithstanding these prior art attempts, there continues to be a need for improved methods of forming bipolar junction transistors.

SUMMARY OF THE INVENTION

It is therefore an object of the present invention to provide improved methods of forming bipolar junction transistors and transistors formed thereby.

It is another object of the present invention to provide methods of forming bipolar junction transistors having improved electrical characteristics and transistors formed thereby.

It is still a further object of the present invention to provide methods of forming bipolar junction transistors with improved base region characteristics and reduced parasitic capacitance, and transistors formed thereby.

These and other objects, features and advantages of the present invention are provided by methods of forming bipolar junction transistors which include the steps of forming a base electrode of second conductivity type (e.g., P-type) on a face of a substrate. A conductive base electrode extension layer is then formed in contact with a sidewall of the base electrode. The base electrode extension layer may be doped or undoped. An electrically insulating base electrode spacer is then formed on the conductive base electrode extension layer, opposite the sidewall of the base electrode. The conductive base electrode extension layer is then etched to preferably define an L-shaped base electrode extension, using the base electrode spacer as an etching mask. Dopants of second conductivity type are then diffused from the base electrode, through the base electrode extension and into the substrate to define an extrinsic base region therein. This diffusion step can be performed in a controlled manner to limit the extent to which the extrinsic base region dopants adversely affect the electrical characteristics of surrounding regions or contribute to parasitic capacitance. Dopants of second conductivity type are also preferably implanted into the substrate to define an intrinsic base region therein. This dopant implant step is preferably performed using the base electrode spacer as an implant mask. Accordingly, the base electrode spacer is used advantageously as an etching mask and as a dopant implantation mask. An emitter region of first conductivity type is also preferably formed in the intrinsic base region.

According to another embodiment of the present invention, a preferred bipolar junction transistor comprises a substrate containing a collector region of first conductivity type therein and a base region of second conductivity type within the collector region. An emitter region of first conductivity type is also provided within the base region. A base electrode of second conductivity type is provided on a face of the substrate, adjacent the base region. In addition, a preferred base electrode extension of second conductivity type is provided in contact with a sidewall of the base electrode and in contact with the base region at the face. The base electrode extension is preferably formed to have an L-shaped cross-section. An emitter electrode of first conductivity type is provided on the emitter region and in ohmic contact therewith. The base electrode extension and base electrode are separated from the emitter by a base electrode spacer having a first thickness and a base electrode extension spacer having a second thickness which is unequal to the first thickness, respectively. The transistor is also preferably formed so that the base region comprises an extrinsic base region which is self-aligned to the base electrode extension and an intrinsic base region which is self-aligned to the base electrode spacer. The emitter region is also preferably self-aligned to the base electrode extension spacer.

DESCRIPTION OF PREFERRED EMBODIMENTS

Figure 1:
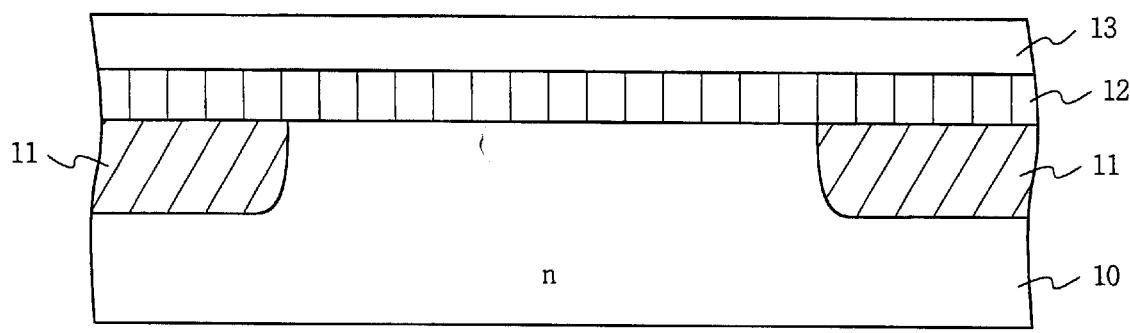
FIGS. 1–4 are cross-sectional views of intermediate structures which illustrate a conventional method of forming a bipolar junction transistor.
Figure 2:
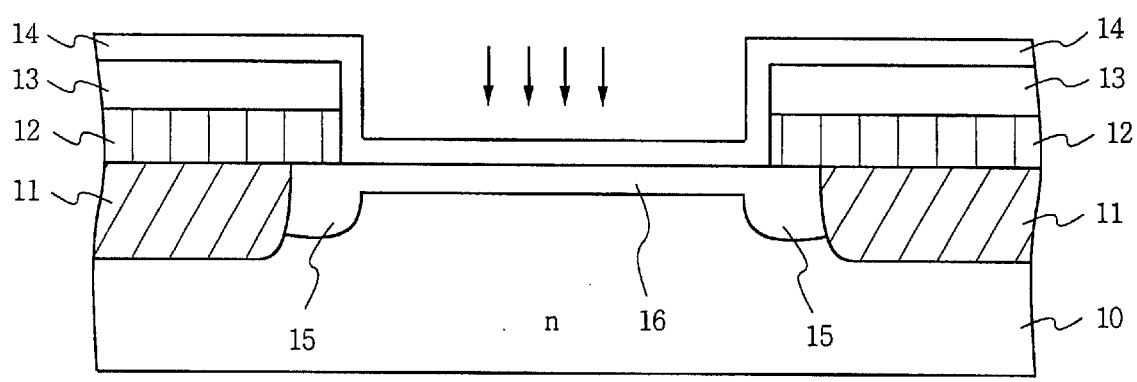
Figure 3:
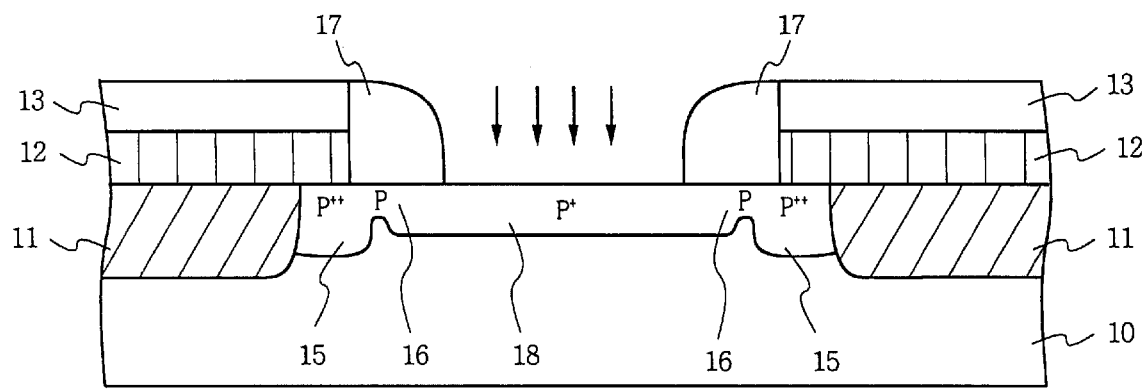
Figure 4:
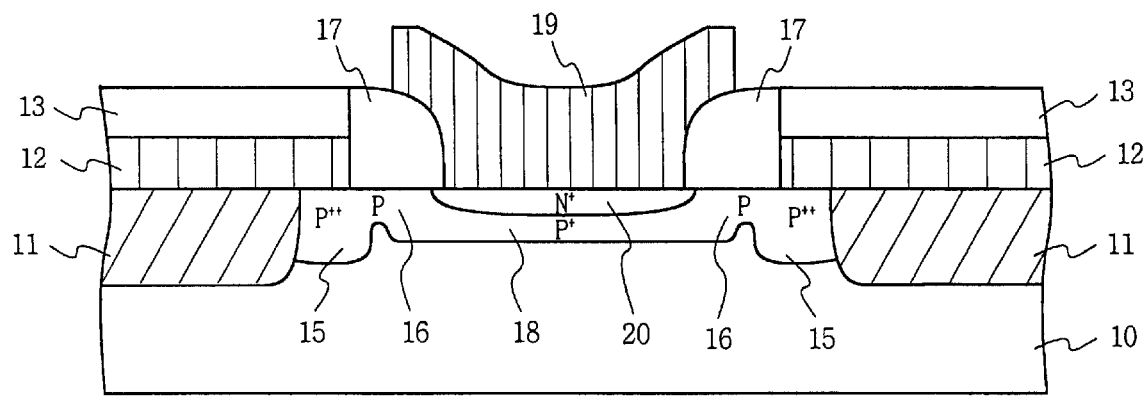

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well. It will also be understood that when a layer is referred to as being "on" another layer or substrate, it can be directly on the other layer or substrate, or intervening layers may also be present.

Figure 5:
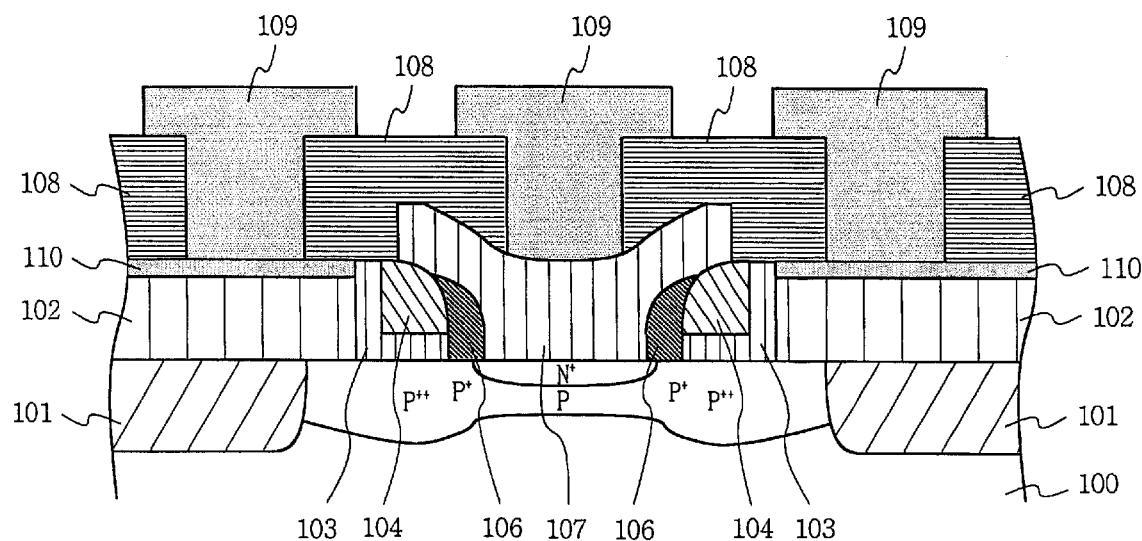
FIG. 5 is a cross-sectional view of a bipolar junction transistor according to a first embodiment of the present invention.
Figure 9:
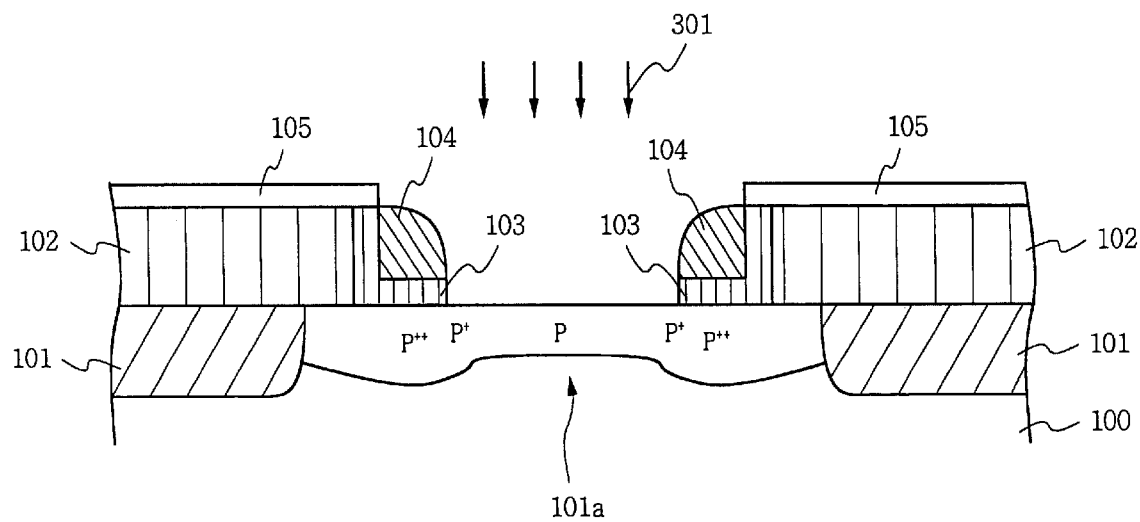
Figure 10:
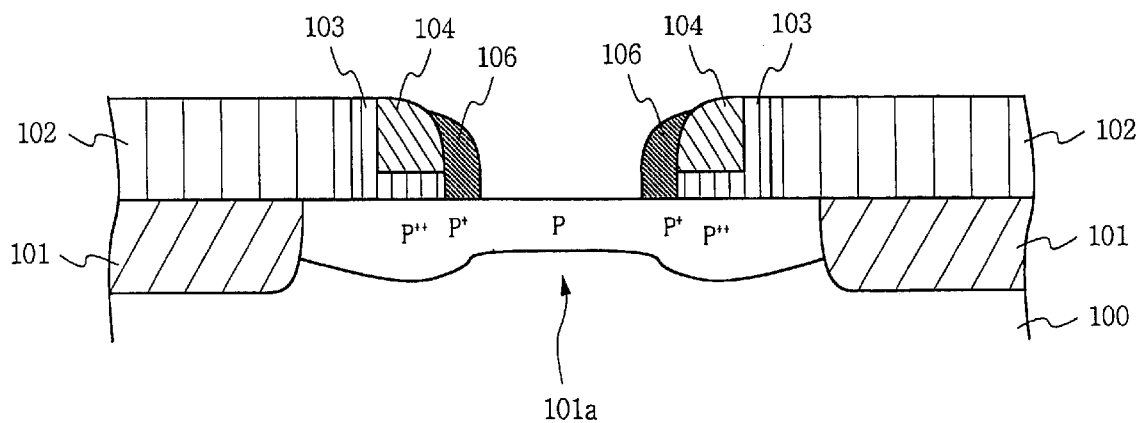
Figure 11:
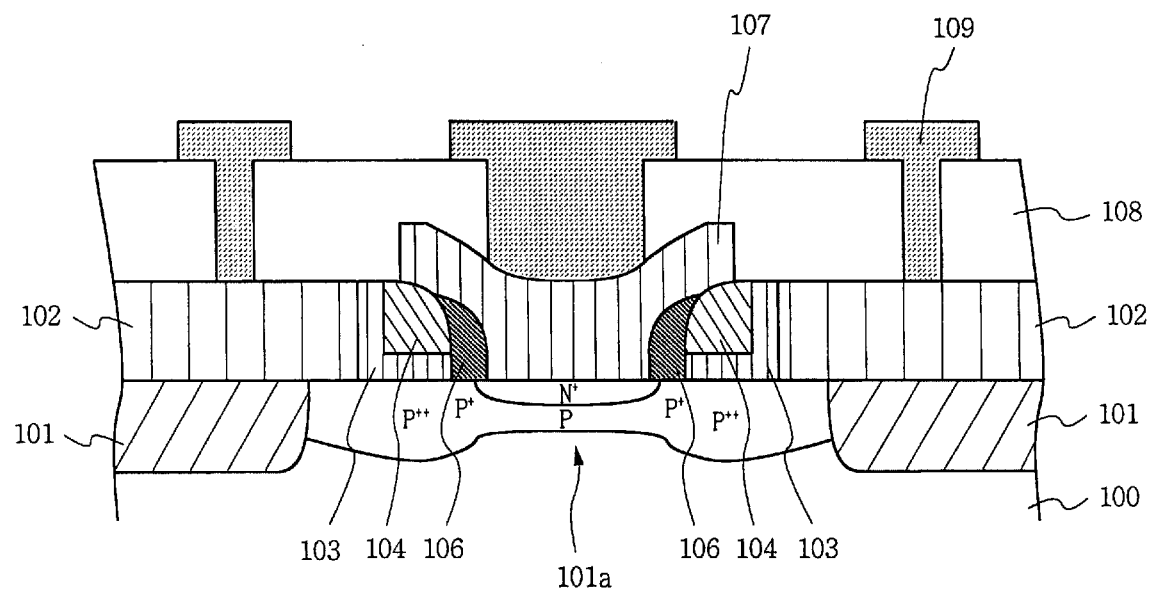

Referring now to FIGS. 5 and 7–11, preferred methods of forming bipolar junction transistors according to first and third embodiments of the present invention will be described. In particular, FIG. 5 is a cross-sectional view of a bipolar junction transistor according to a first embodiment of the present invention and FIG. 11 is a cross-sectional view of a bipolar junction transistor according to a third embodiment of the present invention. The bipolar junction transistors of the first and third embodiments are similar, however, the transistor of the first embodiment includes a silicide base electrode contact layer 110 to reduce base electrode resistance.

Figure 7:
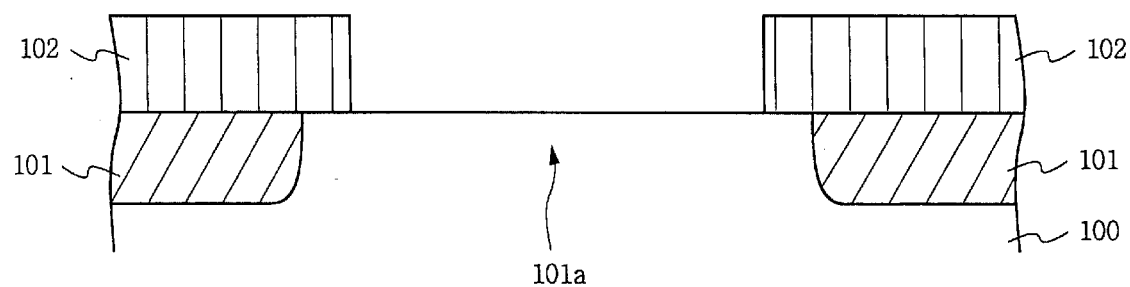
FIGS. 7–11 are cross-sectional views of intermediate structures which illustrate a preferred method of forming a bipolar junction transistor according to a third embodiment of the present invention.

The steps of forming transistors according to the first and third embodiments include the steps of forming field oxide isolation regions 101 adjacent a face of a semiconductor substrate containing a region 100 of first conductivity type therein extending to the face, as illustrated by FIG. 7. This region 100 may be formed as an epitaxial layer of N-type conductivity, for example, and the portion of the region 100 extending between the illustrated field oxide isolation regions 101 may constitute an intrinsic collector region 101a, as described more fully hereinbelow. In place of the field oxide isolation regions 101, isolation regions of second conductivity type (e.g., P-type) may be formed by selectively implanting and then diffusing dopants of second conductivity type into the region 100 of first conductivity type.

A base electrode 102 of second conductivity type (e.g., P-type) may then be formed on the field oxide isolation regions 101 by depositing a first blanket layer of polysilicon and then patterning the first blanket layer of polysilicon to expose the intrinsic collector region 101a, as illustrated by FIG. 7. The first blanket layer of polysilicon may be deposited to a thickness in a range between about 1500 and 4000 Å and may be doped by implanting dopants of second conductivity into an upper surface of the first blanket layer of polysilicon. For example, the dopants of second conductivity type (e.g., B) may be implanted at an energy level of about 15–50 KeV and at a dose level of about 1 $E^{16}$ $cm^{-2}$.

Figure 8:
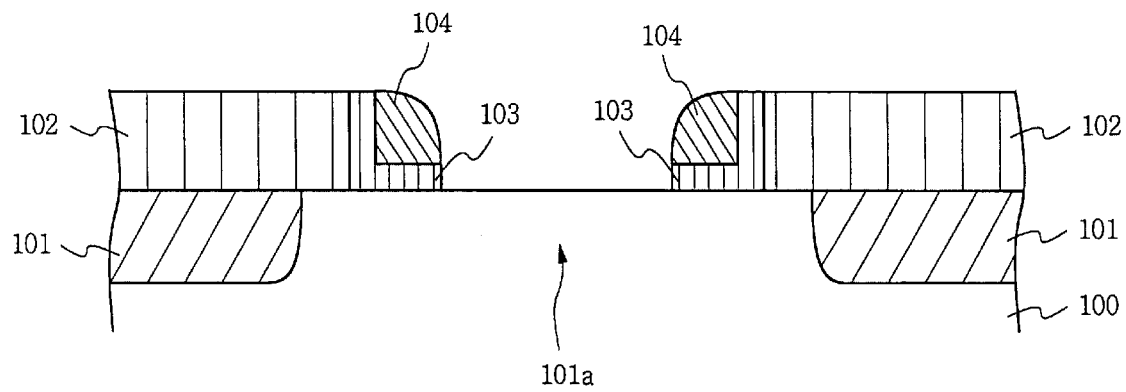

Referring now to FIG. 8, a second blanket layer of polysilicon (having a thickness less than the first blanket layer) is then deposited on an upper surface of the base electrode 102 and in contact with the intrinsic collector region 101a at the face, as a base electrode extension layer. The second blanket layer of polysilicon may be deposited to a thickness in a range between about 200 and 1000 Å and may be undoped or doped by implanting dopants of second conductivity into an upper surface of the second blanket layer. For example, the dopants of second conductivity type (e.g., B) may be implanted at an energy level of about 40 KeV and at a dose level of about $1 \times 10^{14}$ $cm^{-2}$. Thereafter, an electrically insulating base electrode spacer(s) 104 is formed on the base electrode extension layer. The base electrode spacer(s) 104 may be formed by depositing a layer of electrically insulating material (e.g., a nonoxide material such as silicon nitride) to a thickness in a range between about 2000 and 4000 Å, on the base electrode extension layer, and then performing an etch-back process using conventional techniques. The base electrode extension layer may then be etched selectively to define an "L-shaped" base electrode extension(s) 103, using the base electrode spacer 104 as an etching mask. In particular, the etching step may be performed to expose an upper surface of the base electrode 102 and expose the intrinsic collector region 101a. In addition, as illustrated best by FIG. 5, the exposed upper surface of the base electrode 102 may then be covered by a silicide layer 110 to reduce the resistance of the base electrode 102.

Referring now to FIG. 9, a thermal treatment step (e.g., annealing step) is then performed to diffuse second conductivity type dopants from the base electrode 102, through base electrode extension 103 and into the intrinsic collector region 101a to define a base link-up region (shown as P+/P++). This thermal treatment step may also result in the formation of a thin oxide layer 105 on the upper surface of the base electrode 102. The conductivity of the base link-up region may be increased by forming the second blanket layer of polysilicon as a doped layer of second conductivity type (instead of an undoped layer) so that second conductivity type dopants in the base link-up region may be provided by both the base electrode extension 103 and the base electrode 102.

Because the base electrode 102 is relatively heavily doped compared to the intrinsic collector region 101a, the thickness of the thin oxide layer 105 will be greater than the thickness of any thermal oxide layer (not shown) formed on the exposed portion of the intrinsic collector region 101a. This is because the oxidation rate of polysilicon is typically greater than monocrystalline silicon and because oxidation rate is typically proportional to dopant concentration. Accordingly, a short duration etching step may be performed to re-expose the intrinsic collector region 101a, without entirely removing the thin oxide layer 105. The thickness of the resulting thin oxide layer 105 should be in the range of 50–200 Å. Alternatively, the thermal oxide layer (not shown) on the exposed portion of the intrinsic collector region 101 may be used as a sacrificial oxide layer to protect the intrinsic collector region 101a from ion implant damage. Referring still to FIG. 9, dopants 301 of second conductivity type are then implanted into the exposed portion of the intrinsic collector region 101a to define a central intrinsic base region (shown as P) therein. This intrinsic base region forms a non-rectifying junction with the base link-up region (shown as P+/P++).

Referring now to FIG. 10, the thin oxide layer 105 may then be removed to expose the base electrode 102. Next, an electrically insulating base electrode extension spacer(s) 106 is formed in contact with a sidewall of the base electrode extension 103 and the intrinsic base region and/or base link-up region. The base electrode extension spacer 106 may be formed by depositing a blanket layer of a nonoxide material, such as silicon nitride, and then performing an etch-back process of sufficient duration to expose the intrinsic base region at the face.

Referring now to FIG. 11, a highly doped emitter electrode 107 of first conductivity type (e.g., N-type) may then be formed in contact with the exposed portion of the intrinsic base region, as illustrated. The emitter electrode 107 may be formed by depositing a third blanket layer of polysilicon on the structure of FIG. 10 and then performing a blanket implant of first conductivity type dopants into the third blanket layer of polysilicon. A photolithographically defined etching step is then performed to define the emitter electrode 107 and expose the base electrode 102 (and expose a portion of the base electrode spacer 104 so that an inadvertent electrical connection is not made between the emitter electrode 107 and the base electrode 102). The duration of the etching step may also be of sufficient length to etch the base electrode 102 and base electrode extension 103 to a desired thickness. Thereafter, a heat treatment step is performed to diffuse first conductivity type dopants from the emitter electrode 107 into the intrinsic base region to thereby form a relatively highly doped emitter region (shown as N+). A relatively thick passivation layer 108 (e.g., borophosphosilicate glass (BPSG)) is then deposited on the base electrode 102 and emitter electrode 107, as illustrated. Next, base and emitter contact holes are defined in the passivation layer 108 to expose the base electrode 102 and emitter electrode 107. A layer of metallization may then be deposited and patterned on the passivation layer 108 to define base and emitter contacts 109. The above described steps associated with FIG. 11 may also be performed to form the bipolar junction transistor of FIG. 5, which includes a silicide contact layer 110 to reduce the resistance of the base electrode 102. Moreover, because the steps to form the extrinsic base region include dopant diffusion steps which may be carefully controlled, instead of ion implantation steps which offer less control, the characteristics of the intrinsic base region may be decoupled from the extrinsic base region. Accordingly, the characteristics of the intrinsic base region may be designed to achieve high performance operation which is not significantly influenced by extrinsic base region characteristics. In addition, because the size, shape and doping profile of the extrinsic base region may be more carefully controlled (e.g., size may be reduced), reduced parasitic base-to-collector capacitance can be provided.

Figure 6:
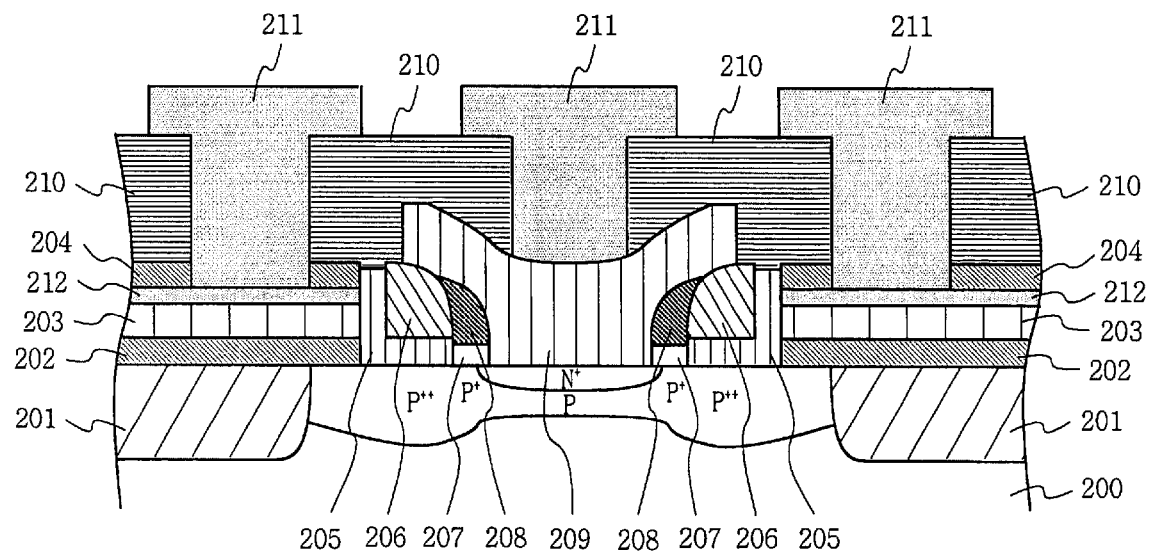
FIG. 6 is a cross-sectional view of a bipolar junction transistor according to a second embodiment of the present invention.
Figure 14:
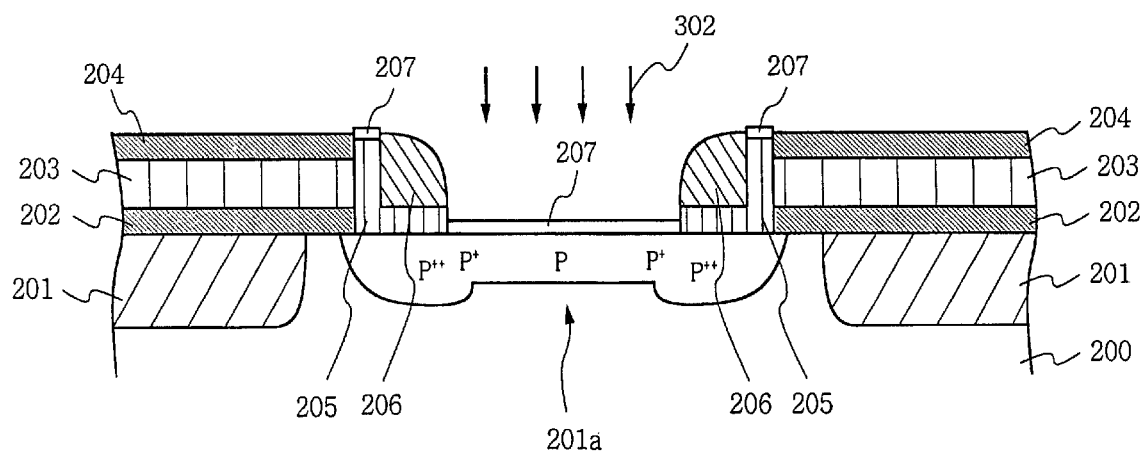
Figure 15:
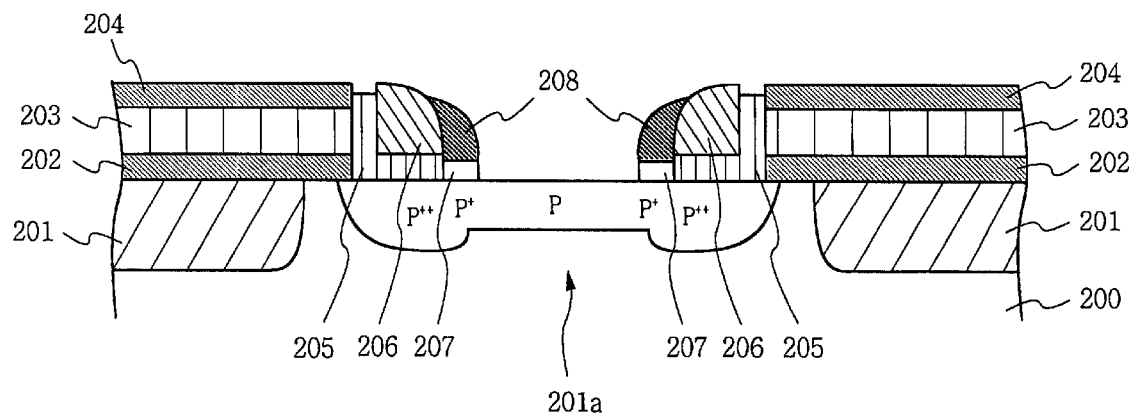
Figure 16:
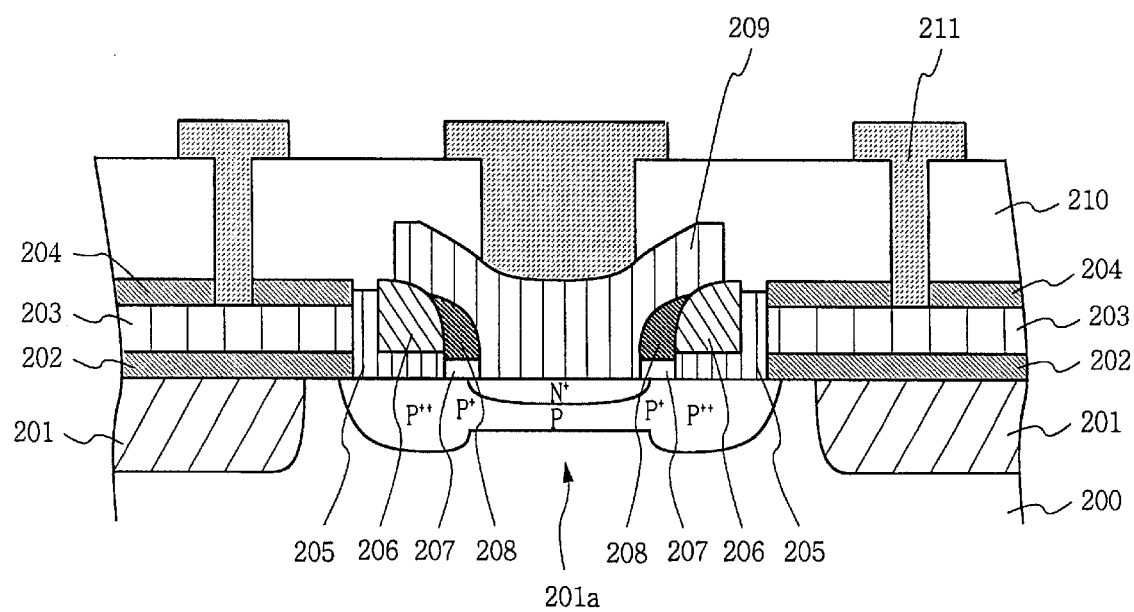

Referring now to FIGS. 6 and 12–16, preferred methods of forming bipolar junction transistors according to second and fourth embodiments of the present invention will be described. In particular, FIG. 6 is a cross-sectional view of a bipolar junction transistor according to a second embodiment of the present invention and FIG. 16 is a cross-sectional view of a bipolar junction transistor according to a fourth embodiment of the present invention. The bipolar junction transistors of the second and fourth embodiments are similar, however, the transistor of the fourth embodiment also includes a silicide base electrode contact layer 212 to reduce base electrode resistance.

Figure 12:
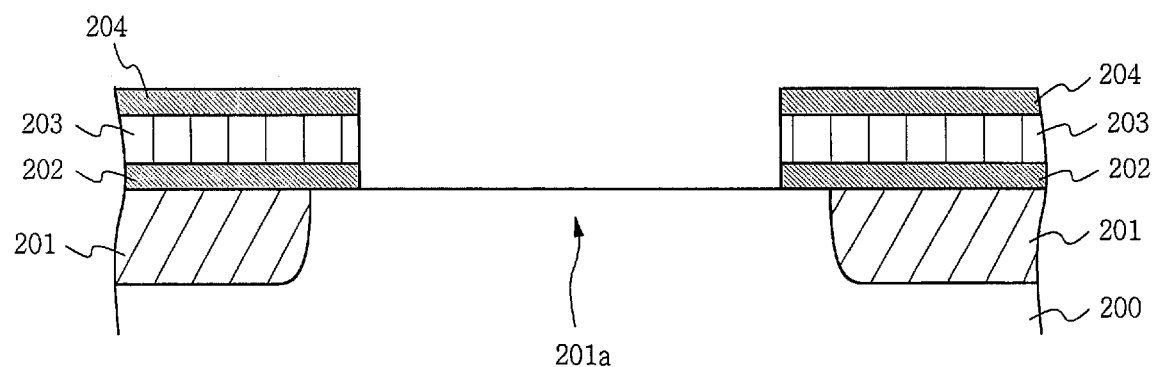
FIGS. 12–16 are cross-sectional views of intermediate structures which illustrate a preferred method of forming a bipolar junction transistor according to a fourth embodiment of the present invention.

The steps of forming transistors according to the second and fourth embodiments include the steps of forming field oxide isolation regions 201 adjacent a face of a semiconductor substrate containing a region 200 of first conductivity type therein extending to the face, as illustrated by FIG. 12. This region 200 may be formed as an epitaxial layer of N-type conductivity, for example, and the portion of the region 200 extending between the illustrated field oxide isolation regions 201 may constitute an intrinsic collector region 201a, as described more fully hereinbelow. In place of the field oxide isolation regions 201, isolation regions of second conductivity type (e.g., P-type) may be formed by selectively implanting and then diffusing dopants of second conductivity type into the region 200 of first conductivity type.

A first isolation layer 202 and base electrode 203 of second conductivity type (e.g., P-type) may then be formed on the field oxide isolation regions 101 by depositing a first layer of silicon dioxide on the face of the substrate 200 and then depositing a first blanket layer of polysilicon on the first layer of silicon dioxide. The first blanket layer of polysilicon may be deposited to a thickness in a range between about 1500 and 4000 Å and may be doped by implanting dopants of second conductivity into an upper surface of the first blanket layer. For example, the dopants of second conductivity type (e.g., B) may be implanted at an energy level of about 15–50 KeV and at a dose level of about $1E^{16}$ cm$^{-2}$. Next, a second layer of silicon dioxide is formed on an upper surface of the first blanket layer of polysilicon. This second layer of silicon dioxide may be formed by depositing a layer of silicon dioxide having a thickness in a range between about 2000 and 4000 Å, on the first blanket layer of polysilicon. Prior to this step of depositing a second layer of silicon dioxide, a layer of silicide may be deposited on the upper surface of the first blanket layer of polysilicon and in ohmic contact therewith to reduce the net resistance of the subsequently formed base electrode 203. The second layer of silicon dioxide, the first blanket layer of polysilicon and the first layer of silicon dioxide are then patterned to expose the intrinsic collector region 201a and define the second isolation layer 204, the base electrode 203 and the first isolation layer 202, as illustrated by FIG. 12. Here, the presence of the first isolation layer 202 separates the base electrode 203 from the face of the substrate and this separation can be used advantageously to reduce parasitic base-to-collector capacitance.

Figure 13:
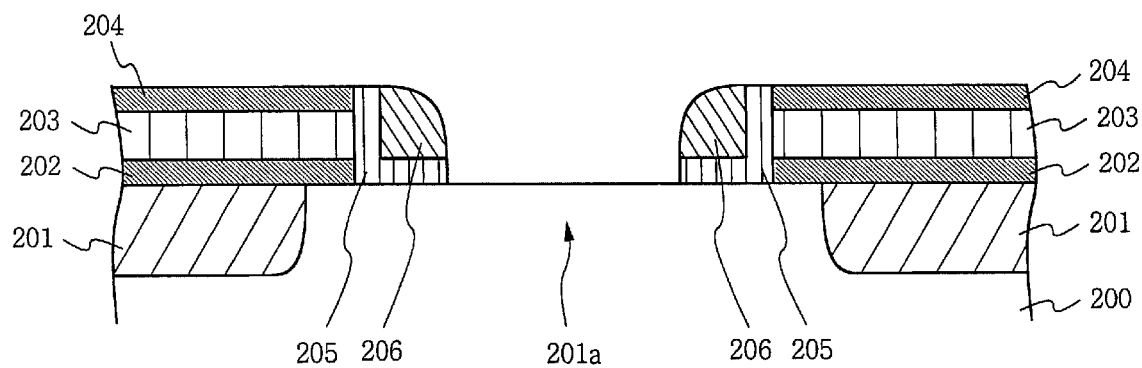

Referring now to FIG. 13, a second blanket layer of polysilicon (having a thickness less than the first blanket layer) is then deposited on an upper surface of the second isolation layer 204 and in contact with the intrinsic collector region 201a at the face, as a base electrode extension layer. The second blanket layer of polysilicon may be deposited to a thickness in a range between about 200 and 1000 Å and may be undoped or doped by implanting dopants of second conductivity into an upper surface of the second blanket layer. For example, the dopants of second conductivity type (e.g., B) may be implanted at an energy level of about 40 KeV and at a dose level of about $1 \times 10^{14}$ cm$^{-2}$. Thereafter, an electrically insulating base electrode spacer(s) 206 is formed on the base electrode extension layer. The base electrode spacer(s) 206 may be formed by depositing a layer of electrically insulating material (e.g., a nonoxide material such as silicon nitride) to a thickness in a range between about 2000 and 4000 Å, on the base electrode extension layer, and then performing an etch-back process using conventional techniques. The base electrode extension layer may then be etched selectively to define an "L-shaped" base electrode extension(s) 205, using the base electrode spacer 206 as an etching mask. In particular, the etching step may be performed to expose an upper surface of the second isolation layer 204 and expose the intrinsic collector region 201a.

Referring now to FIG. 14, a thermal treatment step (e.g., annealing step) is then performed to diffuse second conductivity type dopants from the base electrode 203, through base electrode extension 205 and into the intrinsic collector region 201a to define a base link-up region (shown as P+/P++). This thermal treatment step may also result in the formation of a thin oxide layer 207 on the intrinsic collector region 201a and on the base electrode extension 205, as illustrated. The thin oxide layer 205 may have a thickness in a range between about 50 and 200 Å. The conductivity of the base link-up region may also be increased by forming the second blanket layer of polysilicon as a doped layer of second conductivity type (instead of an undoped layer) so that dopants in the base link-up region may be provided by both the base electrode extension 205 and the base electrode 203. Next, dopants 302 of second conductivity type are implanted through the thin oxide layer 207 and into the intrinsic collector region 201a to define a central intrinsic base region (shown as P) therein. This intrinsic base region forms a non-rectifying junction with the base link-up region (shown as P+/P++).

Referring now to FIG. 15, an electrically insulating base electrode extension spacer(s) 208 is formed on the thin oxide layer 207 and in contact with the base electrode spacer 206. The base electrode extension spacer 208 may be formed by depositing a blanket layer of a nonoxide material, such as silicon nitride, and then performing an etch-back process of sufficient duration to expose the thin oxide layer 207 and an upper surface of the second isolation layer 204. The thin oxide layer 207 may then be etched to expose the intrinsic base region at the face. Here, the thin oxide layer 207 is preferably formed to be thinner than the second isolation layer 204, so that the thin oxide layer 207 can be completely etched without exposing the base electrode 203.

Referring now to FIG. 16, a highly doped emitter electrode 209 of first conductivity type (e.g., N-type) may then be formed in contact with the exposed portion of the intrinsic base region, as illustrated. The emitter electrode 209 may be formed by depositing a third blanket layer of polysilicon on the structure of FIG. 15 and then performing a blanket implant of first conductivity type dopants into the third blanket layer of polysilicon. A photolithographically defined etching step is then performed to define the emitter electrode 209 and expose the base electrode extension 205 (and expose a portion of the base electrode spacer 206 so that an inadvertent electrical connection is not made between the emitter electrode 209 and the base electrode extension 205). Thereafter, a heat treatment step is performed to diffuse first conductivity type dopants from the emitter electrode 209 into the intrinsic base region define a relatively highly doped emitter region (shown as N+) in the intrinsic base region. A relatively thick passivation layer 210 (e.g., borophosphosilicate glass (BPSG)) is then deposited on the base electrode 203 and emitter electrode 209, as illustrated. Next, base and emitter contact holes are defined in the passivation layer 210 (and second isolation layer 204) to expose the base electrode 203 and emitter electrode 209. A layer of metallization may then be deposited and patterned on the passivation layer 210 to define base and emitter contacts 211. The above described steps may also be performed to form the bipolar junction transistor of FIG. 6 which includes silicide contact layer 212 to reduce the resistance of the base electrode 203.

Figure 17:
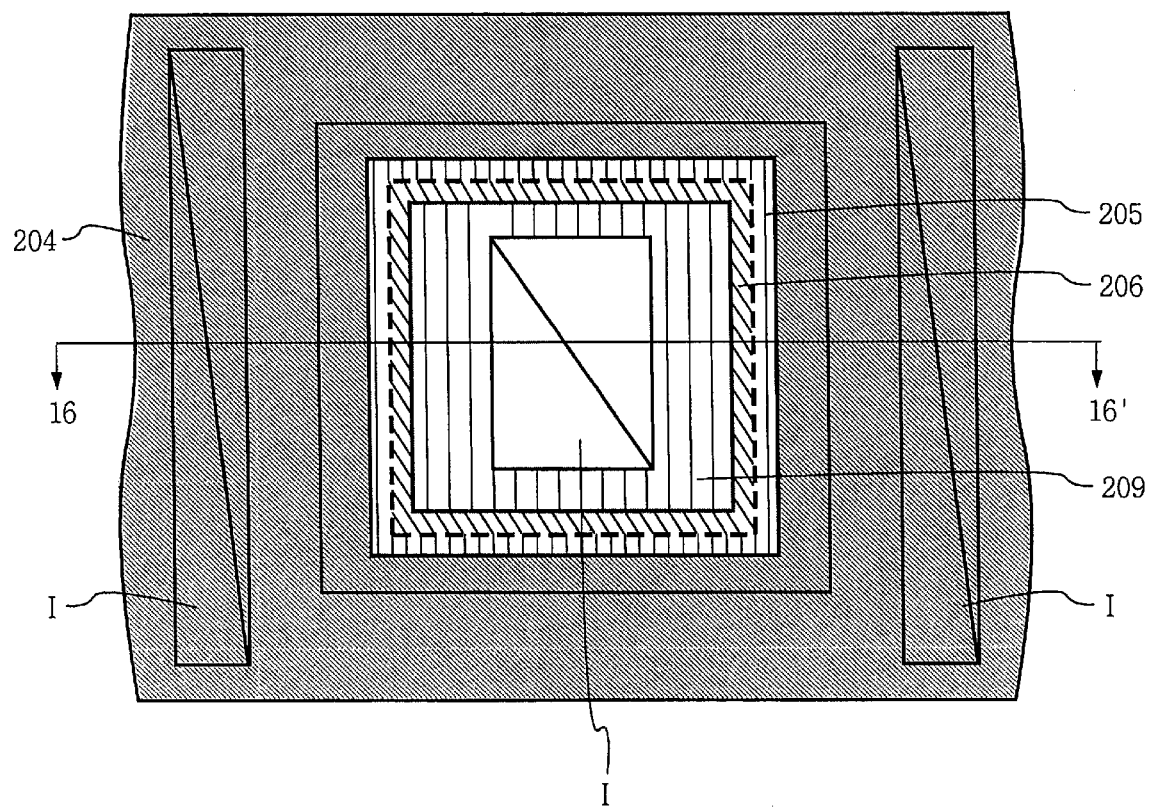
FIG. 17 is a plan layout view of the bipolar junction transistor of FIG. 16.

Referring now to FIG. 17, a plan layout view of a preferred transistor according to the second or fourth embodiments of the present invention is illustrated. Here, FIG. 16 is a cross-sectional illustration of the preferred transistor of FIG. 17, taken along the line 16–16'. The regions marked as "I" represent contact hole regions which are to be formed in the passivation layer 210 of FIG. 16.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bipolar junction transistor, comprising:
    a substrate containing a collector region of first conductivity type therein and a base region of second conductivity type within the collector region and forming a P-N junction therewith;
    an emitter region of first conductivity type in the base region and forming a P-N junction therewith;
    a base electrode of second conductivity type on a face of said substrate, adjacent the base region;
    a base electrode extension of second conductivity type contacting a sidewall of said base electrode and contacting the base region at the face, said base electrode extension having an L-shaped cross-section;
    an emitter electrode of first conductivity type on the emitter region and in ohmic contact therewith;
    a base electrode spacer having a first thickness, disposed between said emitter electrode and a portion of said base electrode extension which extends opposite the sidewall of said base electrode; and
    a base electrode extension spacer having a second thickness, disposed between said emitter electrode and a sidewall of said base electrode extension.

2. The transistor of claim 1, wherein the base electrode spacer and base electrode extension spacer both comprise silicon nitride.

3. The transistor of claim 1, wherein the base region comprises an intrinsic base region and an extrinsic base region; wherein the extrinsic base region is self-aligned to said base electrode extension; wherein the intrinsic base region is self-aligned to the base electrode spacer; and wherein said emitter region is self-aligned to said base electrode extension spacer.

4. The transistor of claim 1, wherein the first thickness is unequal to the second thickness.

* * * * *

UNITED STATES PATENT AND TRADEMARK OFFICE
CERTIFICATE OF CORRECTION

PATENT NO. : 6,255,716 B1
DATED : July 3, 2001
INVENTOR(S) : Hee-Seog Jeon

It is certified that error appears in the above-identified patent and that said Letters Patent is hereby corrected as shown below:

Title page,
Item [62], please change "May 28, 1997, now Pat.. No. 6,048,773" to -- May 28, 1998, now Pat No. 6,048,773 --.

Signed and Sealed this

Twenty-ninth Day of January, 2002

Attest:

Attesting Officer

JAMES E. ROGAN
Director of the United States Patent and Trademark Office